(12) United States Patent
Chang et al.

(10) Patent No.: US 11,302,366 B2
(45) Date of Patent: Apr. 12, 2022

(54) METHOD AND SYSTEM FOR ENHANCED READ PERFORMANCE IN LOW PIN COUNT INTERFACE

(71) Applicant: MACRONIX INTERNATIONAL CO., LTD., Hsinchu (TW)

(72) Inventors: Kuen-Long Chang, Taipei (TW); Su-Chueh Lo, Hsinchu (TW); Yung-Feng Lin, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 9 days.

(21) Appl. No.: 17/070,340

(22) Filed: Oct. 14, 2020

(65) Prior Publication Data

US 2021/0280222 A1 Sep. 9, 2021

Related U.S. Application Data

(60) Provisional application No. 62/985,900, filed on Mar. 6, 2020.

(51) Int. Cl.
*G11C 7/10* (2006.01)
*G11C 7/22* (2006.01)
(Continued)

(52) U.S. Cl.
CPC .......... *G11C 7/1006* (2013.01); *G06F 9/3806* (2013.01); *G06F 9/44505* (2013.01);
(Continued)

(58) Field of Classification Search
CPC ................................. G11C 7/10; G11C 7/1006
(Continued)

(56) References Cited

U.S. PATENT DOCUMENTS 5,768,215 A 6/1998 Kwon et al.
6,134,681 A * 10/2000 Akamatsu ............ G11C 29/842
714/710

(Continued)

FOREIGN PATENT DOCUMENTS

CN 103871447 B 3/2017
JP 2003529883 A 10/2003
(Continued)

OTHER PUBLICATIONS

GD25Q41B Datasheet,rev.1.0—Uniform Sector Dual and Quad Serial Flash,Jul. 16, 2014,ELM Electronics,48 ages.*
(Continued)

*Primary Examiner* — Muna A Techane
(74) *Attorney, Agent, or Firm* — Andrew L. Dunlap; Haynes Beffel & Wolfeld LLP

(57) ABSTRACT

A memory device supporting multi-address read operations improves throughput on a bi-directional serial port. The device includes a memory array and an input/output port having an input mode and an output mode. The input/output port has at least one signal line used alternately in both the input and output modes. A controller includes logic configured to execute a multi-address read operation in response to receiving a read command on the input/output port in the input mode, the multi-address read operation including receiving a first address and a second address using the at least one signal line in the input mode before switching to the output mode, switching to the output mode and outputting data identified by the first address using the at least one signal line.

40 Claims, 10 Drawing Sheets

(51) Int. Cl.
*G06F 9/445* (2018.01)
*G06F 9/38* (2018.01)

(52) U.S. Cl.
CPC .......... *G11C 7/1045* (2013.01); *G11C 7/1057* (2013.01); *G11C 7/1084* (2013.01); *G11C 7/222* (2013.01)

(58) Field of Classification Search
USPC .................................................. 365/230.03
See application file for complete search history.

(56) References Cited

U.S. PATENT DOCUMENTS

| | | | |
|---|---|---|---|
| 6,615,307 | B1 | 9/2003 | Roohparvar |
| 7,423,915 | B2 | 9/2008 | Leong et al. |
| 7,644,224 | B2 | 1/2010 | Murin et al. |
| 7,877,566 | B2 | 1/2011 | Adusumilli |
| 8,261,008 | B2 | 9/2012 | Que |
| 8,358,558 | B2 | 1/2013 | Lee et al. |
| 8,375,273 | B2 | 2/2013 | Hara |
| 8,705,293 | B2 | 4/2014 | She et al. |
| 8,902,668 | B1 | 12/2014 | Dutta et al. |
| 9,009,566 | B2 | 4/2015 | Hung et al. |
| 9,053,762 | B2 | 6/2015 | Hirobe |
| 9,136,006 | B2 | 9/2015 | Hung et al. |
| 9,349,469 | B2 | 5/2016 | Chen et al. |
| 9,411,521 | B2 | 8/2016 | Lu et al. |
| 9,431,123 | B2 | 8/2016 | Kim |
| 9,483,348 | B2 | 11/2016 | Yun |
| 9,536,601 | B2 | 1/2017 | Chen et al. |
| 9,552,882 | B2 | 1/2017 | Tseng et al. |
| 9,690,650 | B2 | 6/2017 | Liu et al. |
| 9,971,647 | B2 | 5/2018 | Michael |
| 2003/0093744 | A1 | 5/2003 | Leung et al. |
| 2004/0109358 | A1 | 6/2004 | Roohparvar et al. |
| 2006/0146607 | A1 | 7/2006 | Hosono et al. |
| 2009/0168530 | A1 | 7/2009 | Yamamura et al. |
| 2010/0049948 | A1 | 2/2010 | Jigour et al. |
| 2010/0246299 | A1* | 9/2010 | Iwai .................. G11C 29/84 365/200 |
| 2011/0063748 | A1 | 3/2011 | Song et al. |
| 2011/0296086 | A1* | 12/2011 | Saitou .................... G11C 29/46 711/103 |
| 2013/0145093 | A1 | 6/2013 | Kaminaga et al. |
| 2013/0286752 | A1 | 10/2013 | Michioka et al. |
| 2013/0346671 | A1 | 12/2013 | Michael et al. |
| 2014/0258811 | A1 | 9/2014 | Liu et al. |
| 2014/0307509 | A1 | 10/2014 | Michael |
| 2015/0049547 | A1 | 2/2015 | Kim |
| 2015/0255167 | A1 | 9/2015 | Gillingham et al. |
| 2016/0034346 | A1 | 2/2016 | Michael |
| 2016/0372184 | A1 | 12/2016 | Shalvi et al. |
| 2017/0109297 | A1 | 4/2017 | Chang et al. |
| 2017/0185353 | A1 | 6/2017 | Intrater et al. |
| 2018/0090202 | A1 | 3/2018 | Kaminaga et al. |
| 2018/0143908 | A1 | 5/2018 | Zhang et al. |
| 2020/0125443 | A1 | 4/2020 | Hung et al. |
| 2020/0142843 | A1 | 5/2020 | Hung |

FOREIGN PATENT DOCUMENTS

| | | |
|---|---|---|
| JP | 2009158015 A | 7/2009 |
| JP | 2013118031 A | 6/2013 |
| TW | 201421238 A | 6/2014 |
| TW | 201830404 A | 8/2018 |
| WO | 0175896 A2 | 10/2001 |

OTHER PUBLICATIONS

Jacronix-MX25L6455EMI-10G—datasheet,Rev.1.4,Feb. 10, 2012,81 pages.*
Jacronix International Co.,Ltd.Technical Note,"Improving NAND Throughput with Two-Plane and Cache perations," Rev.1,Nov. 15, 2013,13 pages.*
IcronTechnology.Inc.Technical Note"NAND Flas h101:An Introduction to NAND Flash and How to Design it into 'our Next Product," TN-29-19,Rev.B,at least a searly as Dec. 2006,27 pages.*
TW Office Action in 11020884520 dated Sep. 10, 2021, with English machine translation, 4 pages.
"3V, 2G/4G-bit NAND Flash Memory, MX30LFx4G18AC", Macronix International Co., Ltd., http://www.macronix.com, Revision 1.4, Jan. 20, 2017, 80 pages.
GD25Q41B Datasheet, rev. 1.0—Uniform Sector Dual and Quad Serial Flash, Jul. 16, 2014, ELM Electronics, 48 pages.
Intel White Paper 327432-004, "Enhanced Serial Peripheral Interface (eSPI) Interface Base Specification (for Client and Server Platforms)," Rev. 1, Jan. 2016, 130 pages.
Macronix International Co., Ltd. Technical Note, "Improving NAND Throughput with Two-Plane and Cache Operations," Rev. 1, Nov. 15, 2013, 13 pages.
Macronix-MX25L6455EMI-10G—datasheet, Rev. 1.4, Feb. 10, 2012, 81 pages.
Micron Technology, Inc. Technical Note "NAND Flash 101: An Introduction to NAND Flash and How to Design it in to Your Next Product," TN-29-19, Rev. B, at least as early as Dec. 2006, 27 pages.
Micron Technology, Inc. Technical Note "NAND Flash Performance Increase Using the Micron Page Read Cache Mode Command," TN-29-01, at least as early as Dec. 2004, 10 pages.
SST Serial Quad I/O (SQI) Flash Memory, SST26VF016 / SST26VF032, Data Sheet, Jun. 2010, 39 pages.
EP Extended EP Search Report from Application No. 19200579.1 dated Mar. 10, 2020, 8 pages.

* cited by examiner

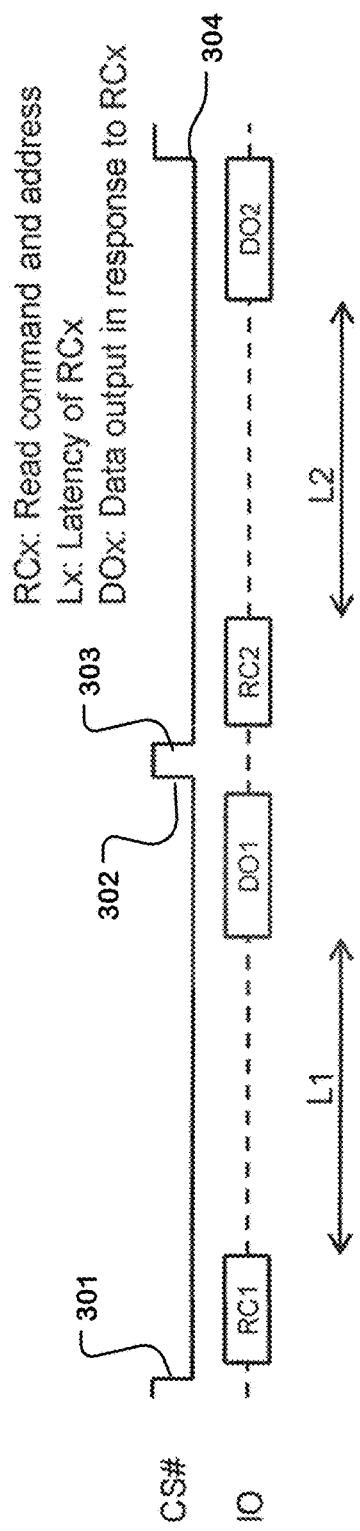
FIG. 3 - Prior Art
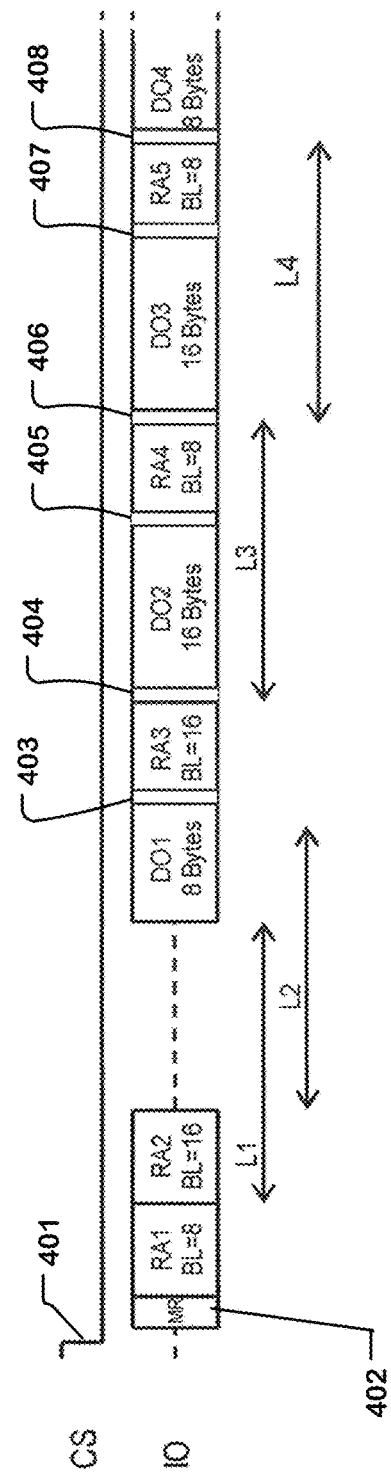
FIG. 4

METHOD AND SYSTEM FOR ENHANCED READ PERFORMANCE IN LOW PIN COUNT INTERFACE

PRIORITY APPLICATION

This application claims the benefit of U.S. Provisional Patent Application No. 62/985,900 filed 6 Mar. 2020; which application is incorporated herein by reference.

BACKGROUND

Field

The present disclosure relates to read operations on serial port memory devices, and to such operations having enhanced throughput and efficiencies.

Description of Related Art

Integrated circuit memory devices receive commands, data and addresses for memory operations, and output data in response on input/output ports. Input/output ports on integrated circuits are often characterized as serial ports or as parallel ports. For example, commercial implementations of NOR flash memory are usually characterized as parallel flash or serial flash. Parallel flash is implemented with many address and output pins, for example 48 pins, to provide random memory access with high throughput. Serial flash is often implemented using the Serial Peripheral Interface SPI configuration, having limited numbers of pins. Of course, other serial input/output port configurations are available. In general, serial flash does not perform as well for random read access as parallel flash.

NOR flash memory, because of the capability of random-access, can be used in execute-in-place (XIP) deployments, where programs are executed from long-term nonvolatile storage, without requiring a step of copying programs into dynamic RAM. However, throughput can be a limitation on use of NOR flash in XIP settings, or other applications that can require high-speed random-access. Serial flash may not be able to provide sufficient throughput for these kinds of applications. However, it is desirable to utilize the serial flash products, because of greatly reduced device pin counts and high-bandwidth capabilities.

Techniques for improving the throughput of serial flash include increasing clock frequency, and increasing the number of I/O pins used in the serial protocol. However, latency involved in internal sense amplifier operations, required for moving data out of the nonvolatile memory into output buffers suitable for outputting the data, does not scale with clock rate and pin count. Thus, this latency can become a major performance bottleneck for random access serial flash.

It is desirable to provide a technology that can enhance read performance for low pin count memory products, such as serial NOR flash.

SUMMARY

Technology described herein enables low pin count memory, capable of receiving and delivering multiple read commands, addresses and data outputs on a bi-directional I/O port, where one or more next read commands or addresses can be issued/received before changing the bi-directional I/O port from input to output mode to output data from a previous command or address.

A memory device supporting multi-address read operations as described herein improves throughput on a bi-directional port. An embodiment of such a device includes a memory array and an input/output port having an input mode and an output mode. The input/output port has at least one signal line used alternately in both the input and output modes. A controller includes logic configured to execute a multi-address read operation in response to receiving a read command on the input/output port in the input mode, the operation including receiving a first address and a second address using the at least one signal line in the input mode before switching to the output mode, switching to the output mode and outputting data identified by the first address using the at least one signal line.

A method for executing a multi-address read operation on a memory device including a memory array and an input/output port having an input mode and an output mode, wherein the input/output port has at least one signal line used alternately in both the input and output modes is described. The method includes, in general, receiving a read command on the input/output port in the input mode in a multi-address read operation, and in response to the read command, receiving a first address and a second address using the at least one signal line in the input mode before switching to the output mode; switching to the output mode; and outputting data identified by the first address using the at least one signal line.

The technology described herein includes a number of protocols for the multi-address read operation. One protocol is described that includes receiving two read addresses, switching to output mode after a read latency for the first address, and outputting the data of the first read address, and then having a sequence of interleaved read address, I/O turn around, and data output phases. Another protocol is described that includes receiving a sequence including at least two read addresses, switching to output mode after receiving the sequence of read addresses and expiry of a read latency appropriate for data to be output, and outputting the data chunks of the sequence of read addresses in a non-interleaved mode. Yet another protocol is described that includes receiving at least two read commands with read addresses in sequence without switching to the output mode, internally moving data identified by the read addresses from the memory array to an input/output buffer, and then receiving read-out commands with addresses identifying chunks of data in the input/output buffer, and outputting the data chunks in response to the read-out commands.

Technology described herein provides for optimization of throughput for memory devices for low pin count integrated circuits. The technology described herein improves throughput for low pin count NOR flash integrated circuits, and other type of memory integrated circuits being deployed for XIP systems and other systems relying on efficient random access to nonvolatile memory.

Other aspects and advantages of the present technology can be seen on review of the drawings, the detailed description and the claims, which follow.

BRIEF DESCRIPTION OF THE DRAWINGS

FIG. 3 illustrates a prior art read protocol for a serial port having a bidirectional I/O port.

FIG. 4 illustrates an enhanced read protocol having interleaved data output phases and read address input phases after an initial data output phase according to a first embodiment of the technology described herein.

DETAILED DESCRIPTION

A detailed description of embodiments of the present invention is provided with reference to the FIGS. 1-13.

Figure 1:
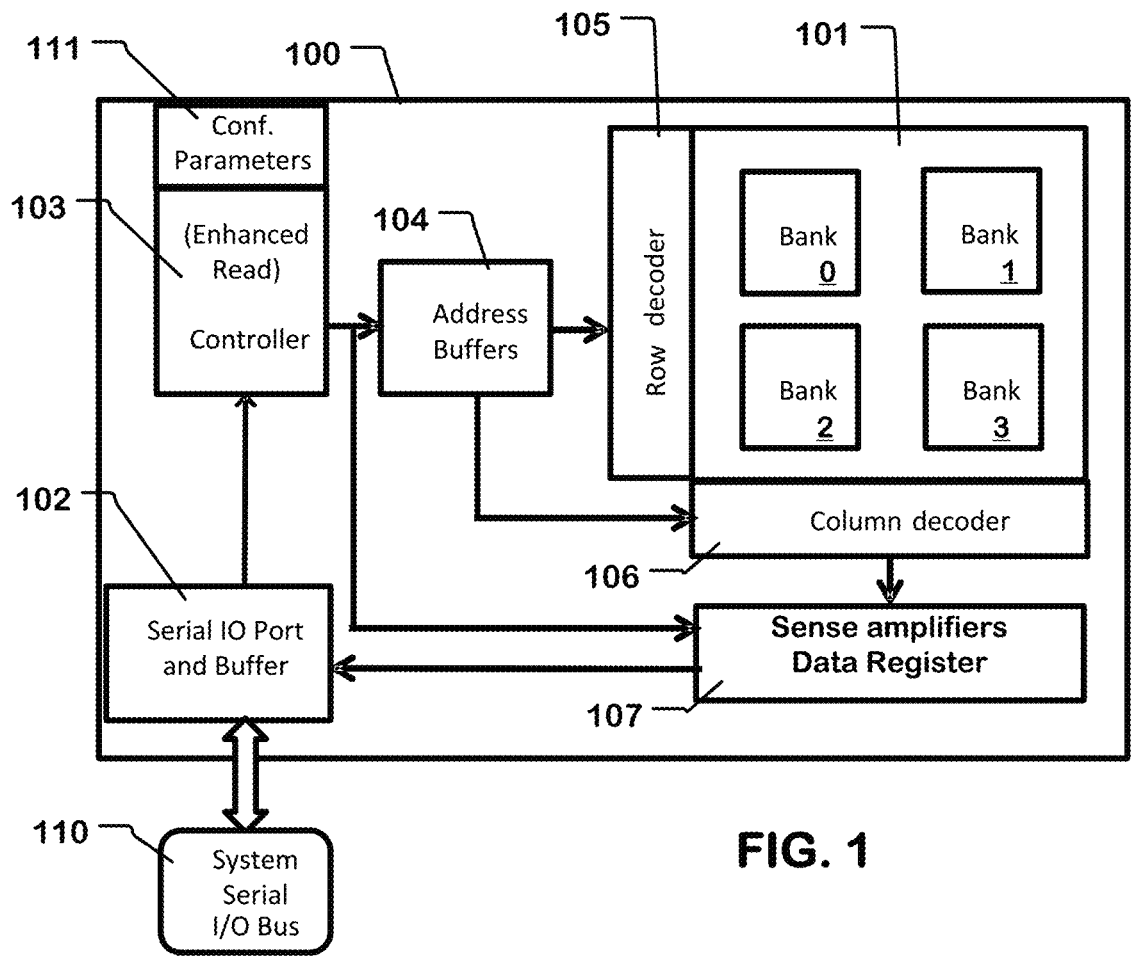
FIG. 1 is a is a simplified diagram of an integrated circuit memory having a bi-directional input/output port and enhanced read capabilities as described herein.

FIG. 1 is a simplified diagram of a memory device 100 including a memory array 101 that comprises a plurality of banks, bank 0, bank 1, bank 2, bank 3 in this example. The memory device 100 includes a bi-directional I/O port 102 including a data buffer, connected by signal lines to a system serial I/O bus 110. The I/O port 102 has an input mode and an output mode for each bidirectional signal line, including at least one signal line used in both the input and output modes of a multi-address read operation as described herein.

The memory device 100 includes a controller 103 with an enhanced read command decoder, connected to the I/O port 102 and controls the components of the device to execute read operations in response to commands and addresses, and output resulting data. In the illustration, the controller 103 is connected to address buffers 104, and to sense amplifiers (including a data register) 107. The address buffers 104 connect to a row decoder 105 and column decoder 106. In a read operation, a command and one or more addresses are received on the I/O port 102, and decoded by the command decoder in controller 103. The controller 103 executes logic to perform the operation indicated by the command, including accessing the memory array 101, causing sense amplifiers to load a data register with the data from the memory array, and transferring data from the data register in the sense amplifiers 107 via the I/O port 102 onto the system serial I/O bus 110. The time interval between decoding a read command, and receiving output data at the port 102 to be supplied on the system serial I/O bus 110 is referred to as a read latency which is determined by the performance characteristics of the memory array. In some embodiments, configuration parameters for a multi-address read operation are stored in configuration registers 111 accessible by the controller 103, and used in execution of a multi-address read operation as described herein.

In embodiments described herein, a first read command can be received, and the operation begun by the controller 103, and during the read latency for the first read command, a second read address can be received, before changing the I/O port to the output mode and delivering the data output in response to the first read command on the system serial I/O bus 110.

For the purposes of this description the term "bus" refers to a communication system that transfers data between bus nodes. The I/O port 102 on the device 100 is a bus node on the system serial I/O bus 110. The I/O port includes the signal lines (physical layer connectors like wires, pins, contact pads or balls, optical fiber, etc.), and input/output circuits including drivers on the devices that together implement a communication protocol.

Figure 2:
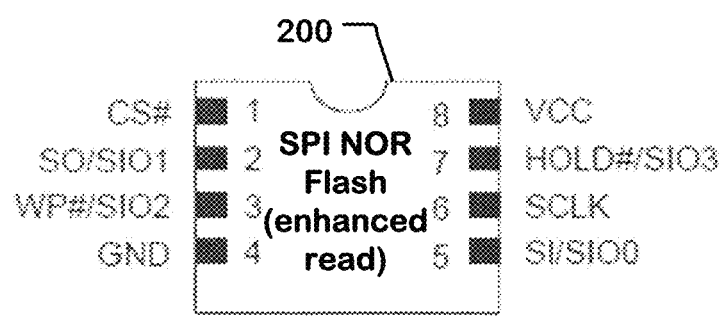
FIG. 2 illustrates a serial NOR flash having an 8-pin SPI interface, and supporting enhanced read capabilities as described herein.

FIG. 2 illustrates an SPI NOR flash package 200 that can support enhanced read capabilities as described herein. The illustrated package is an 8-pin package, including pins for power (8) and ground (4). The six remaining pins include a chip select CS #pin (1), a serial clock SCLK pin (6), and four pins (2, 3, 5, 7) that can be configured as bidirectional signal lines SI/O0, SI/O1, SI/O2, SI/O3. Each of the four pins can be configured in other operating modes as well, including output mode signal line SO on pin 2, a control signal WP # on pin 3, a control signal HOLD # on pin 7, and an input mode signal line SI on pin 5. According to the SPI standard, in a quad mode, for example, all four of the bidirectional signal lines can be used in an input mode and an output mode in multi-address read operations as described herein.

Serial Peripheral Interface SPI devices in dual or quad modes use the same pins for input of commands and addresses, and output of read data in response to the input commands and addresses. Thus, the interface includes at least one line which has an input mode and an output mode and must change modes between input mode and output mode to complete a read operation executed on the device in response to a single command. The change between input mode and output mode on an I/O pin can be referred to as a turn-around phase. See, Enhanced Serial Peripheral Interface (eSPI) Interface Base Specification (for Client and Server Platforms), Rev. 1, Intel, January 2016.

FIG. 3 illustrates a read protocol on a bidirectional I/O port according to the prior art. In this protocol, the chip select signal is transitioned at time 301 and a first read command and address RC1 are received. After a read latency L1, the data output in response to the first read command and address is provided on the bidirectional I/O port, and the chip select signal is transitioned at time 302. For a next read command, the chip select signal is transitioned at time 303, and the second read command and address RC2 is received. After a read latency L2, the data output, in response to the second read command and addresses provided on the bidirectional I/O port and the chip select signal, is transitioned at time 304. During the read latency times L1 and L2, the bidirectional I/O port can be held in a sequence of dummy cycles. This sequence can continue as the host reads data from the chip. However, the read latency times L1 and L2 limit the available throughput.

FIG. 4 shows an embodiment of an enhanced read protocol according to the present technology. In this protocol, the chip select signal is transitioned at time 401, and a multi-read MR command 402 is received followed by two read addresses RA1 and RA2 by the bidirectional I/O port in the input mode.

Immediate data in a command and address sequence is defined as a variable or flag received with or as part of the command or address, and applied in execution of the command. In the embodiment shown in FIG. 4, immediate data including a burst length parameter BL is provided with the read addresses indicating a length of a data chunk to be output at the corresponding address in this embodiment. For the purposes of this description, the term "burst" does not imply any particular bus operation but rather is used as a label of the parameter indicating chunk length, although in some embodiments an entire chunk can be output in a single burst operation on the bus. In this example, a burst length of eight bytes is provided with read address RA1, and a burst length of 16 bytes is provided with read address RA2. The burst length values can be constrained in some embodiments to a certain predetermined number of options. In other embodiments, the burst length values are constrained only by the size of the immediate data provided with the read address used to define the burst length. In other embodiments, the burst length is a parameter stored in a configuration register.

After the read latency L1 for the first read address RA1, the I/O port changes from the input mode to the output mode, and the eight bytes of data chunk DO1 from RA1 are output on the I/O port. After finishing outputting data chunk DO1, the I/O port executes a turnaround at time 403, and receives a next read address RA3 with a burst length parameter. Then, the I/O port executes a turnaround at time 404, and the 16 bytes of data chunk DO2 from RA2 are output on the I/O port. Then, the I/O port executes a turnaround at time 405, and receives a next read address RA4 with a burst length parameter. Then, the I/O port executes a turnaround at time 406, and the 16 bytes of data chunk DO3 from RA3 are output on the I/O port. Then, the I/O port executes a turnaround at time 407, and receives a next read address RA5 with a burst length parameter. Then, the I/O port executes a turnaround at time 408, and the 8 bytes of data chunk DO4 from RA4 are output on the I/O port. The interleaved RA(x)-data chunk DO(x−1) sequence can continue as needed, receiving address RA(x), turning around the I/O port, and outputting data of the preceding command data chunk DO(x−1) identified by a preceding read address RA(x−1) in the sequence, in this example, in which the initial input mode receives two read addresses, RA1 and RA2. The end of the sequence can be signaled by transition of the chip select signal.

Note that the timing of outputting of data chunk DO3 may not coincide with the end of the input of RA4, because of the read latency L3 requirements.

Figure 5:
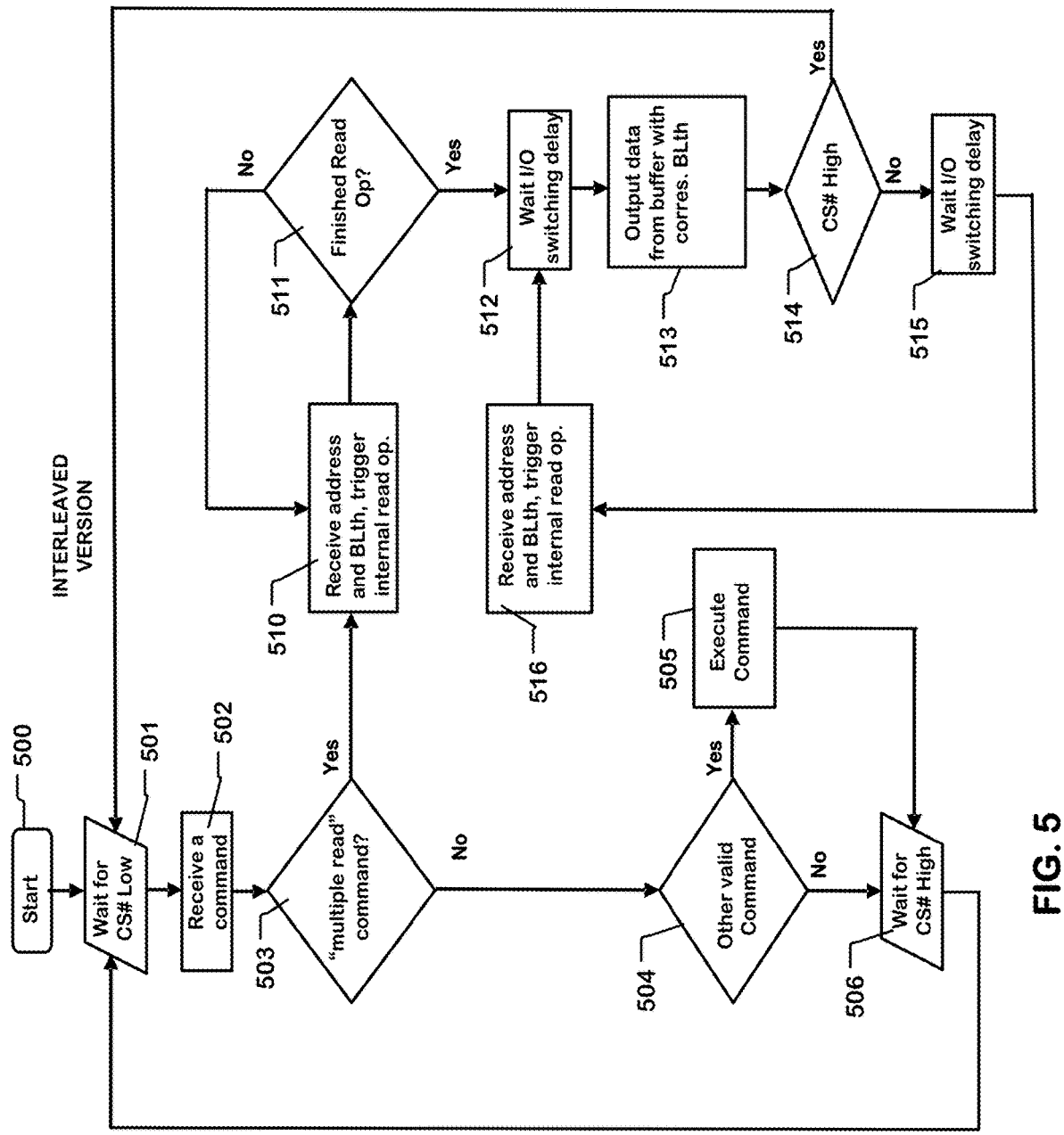
FIG. 5 illustrates a command decoder and control logic for an enhanced read protocol like that of FIG. 4.
Figure 6:
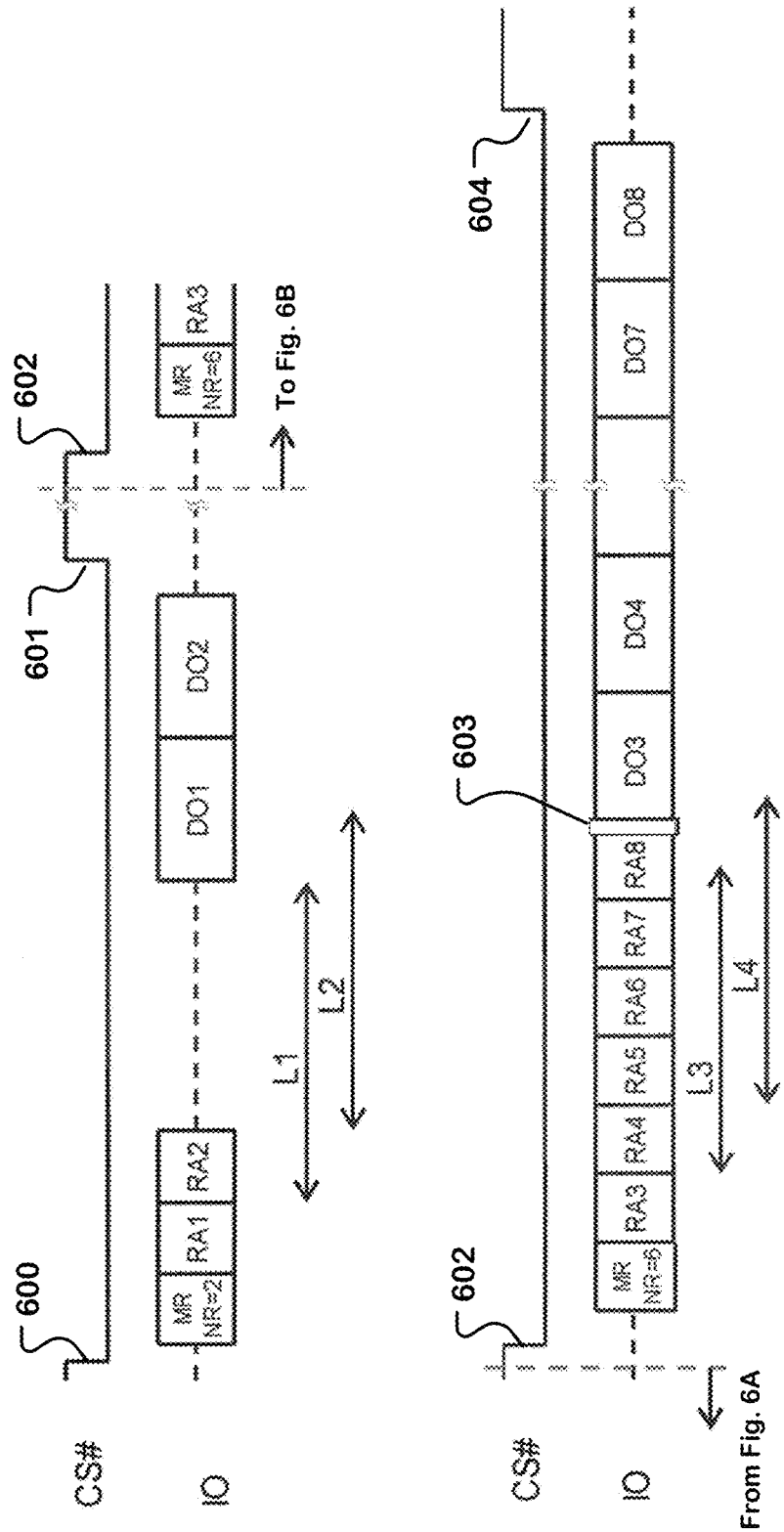
FIGS. 6A and 6B illustrate an enhanced read protocol having non-interleaved data output and read address input phases supporting multiple read commands according to a second embodiment of the technology described herein.

FIG. 5 is a flowchart illustrating operation of the command decoder and controller for the execution of a protocol like that of FIG. 4, receiving two read addresses, switching to output mode of the read latency for the first address and outputting the data of the first read address, and then having a sequence of interleaved read address and data output phases. The operation starts at block 500. The controller waits for transition of the chip select signal to a low state for an active low system (501). Upon transition of the chip select signal, a command is received (502). The command is decoded and it is determined whether it is a multiple read command MR (503). If not, it is determined whether another valid command is received (504). If another valid command is received, then the command is executed (505). After executing the command, or if a valid command was not received at block 504, the procedure waits for transition of the chip select signal 506. Upon transition of the chip select signal, the algorithm returns to block 501 to wait for a subsequent transition of the chip select signal.

If at block 503, it is detected that a multiple read command is received, then the address and burst length parameters are received on the I/O port in an input mode, and an internal read operation using, for example, a read state machine adapted for the particular type of memory array, is triggered using the received address (510). The controller waits until the internal read operation is completed (511) and the data is available at the I/O port, as indicated by the looping back to block 510. Upon completion of the read operation, the controller waits an I/O switching delay while the I/O port is turned around (512). After the switching delay, the data is output from the buffer in the I/O port with a corresponding burst length (513). It is then determined whether the chip select signal has transitioned at step 514. If not, then the controller waits for another I/O switching delay (515) turning back to the input mode. Then, the controller receives a next address and associated burst length parameter, and triggers an internal read operation (516). The procedure then returns to block 512, and waits for the I/O port to turn around, and then outputs data from the buffer with the corresponding burst length for a preceding read address (513), and the procedure continues until the chip select signal is transitioned high. When it is determined that the chip select signal is high at block 514, then the procedure returns to block 501 to wait for transition of the chip select signal again to start a new sequence.

In this embodiment, there may be an unnecessary address input before the last data output. For example, if the system just wanted to output data chunk DO1 to data chunk DO4, the system could set the chip select signal to transition after finishing data chunk DO4. Because the system is waiting for a new read address input after data chunk DO3, the host would be required to issue a dummy read address RA5 before outputting data chunk DO4. To address this problem, in one embodiment each read address RAx can be received with immediate data in the form of a final read flag FR. Thus, the final read flag could be clear (0) for RA1 to RA3 and set (1) for RA4. In this case, data chunk DO4 could seamlessly follow data chunk DO3.

In some embodiments, the adjacent read addresses RA(x) and RA(x+1) may have some constraints. For example, RA1 and RA2 may be required to address different banks of the memory array, and RA2 and RA3 may be required to address different banks of the memory array, while RA1 and RA3 may fall in the same bank.

In another embodiment, each read address may be provided with immediate data indicating a burst length so each RAx may be associated with different size data chunks.

In another embodiment, the MR command may be received with immediate data indicating the number of reads NR and burst length BL for the multi-read operation. Also, the burst length may be set by a parameter register or otherwise pre-configured.

Also, the MR command can carry other parameters as immediate data, such as output strength parameters used to set a drive strength of drivers in the I/O port for the operation.

FIGS. 6A and 6B show another embodiment of an enhanced read protocol according to the present technology. Referring to FIG. 6A, in this protocol, the chip select signal is transitioned at time 600, and a multi-read command MR is received, with immediate data indicating the number of read addresses NR to be included in the operation. In this example, the first multi-read MR command includes NR equals two. While the I/O port is in the input mode, two read addresses RA1 and RA2 are received. The I/O port is in a dummy cycle or waiting state, during which it can change to the output mode. After a read latency L1 for the first read address RA1, the data chunk DO1 from the first read address is output, followed by output of data chunk DO2 from the second read address. Data chunk DO2 can be output on the I/O port beginning in a clock cycle immediately following the last bit of data chunk DO1. After the output of the data chunk DO2, the chip select signal is transitioned at time 601. Then, the system waits for chip select transition at time 602, followed by, in this example, another multi-read command including a number of reads NR equal to six.

FIG. 6B picks up the sequence just prior to the transition of the chip select signal at time 602. After the multi-read command MR, six read addresses RA3 to RA8 are received in sequence, without exiting the input mode on the I/O port. Then, the I/O port turns around at time 603. After the turnaround delay, the data chunks DO3 through DO8 are output in sequence. After finishing the outputting of data chunk DO8, the chip select signal transitions again at time 604. In this example, the I/O port finishes receiving RA8 after expiration of the read latency L3 associated with the first read address RA3 associated with this MR command. By doing a non-interleaved multiple read command including issuing a sequence of addresses, followed by contiguous data output from the sequence of addresses, the bus transfer efficiency is greatly improved. Bus idle time due to waiting for read latency is greatly reduced or eliminated.

In other examples, having a fewer number of read addresses, for example, there may be a latency required before outputting the data chunk DO3 and the following chunks of data as the system waits for the read latency L3 to complete.

In variations of the embodiment illustrated in FIGS. 6A and 6B, a number of reads NR parameter can be specified as immediate data with the multi-read command code as discussed above, at the same clock latching edge or a nearby clock latching edge between the multi-read command in the first read address. In some embodiments, the read number NR is preconfigured to a number, such as four, as a parameter in a configuration register, and not specified with the multi-read command. In this case, the system is set up to read a specified number of addresses and provide a specified number of outputs for each command cycle.

As discussed above, the read addresses in the sequence may have some constraints, such as reading from different banks and the like.

In other embodiments, the second multi-read command MR can be issued without transition of the chip select signal. For example, the second MR command may be received right after finishing the output data chunk DO2, while chip select remains low. Bus utilization efficiency is further improved by reducing bus idle time while chip select is high. In embodiments shown in FIGS. 6A and 6B, the burst length BL (data length) is pre-configured. In another embodiment, the burst length BL can be carried as immediate data with the multi-read command. Also, in an alternative, the burst length can be carried as immediate data with each read address, so that the size of the output data associated with each read address can vary.

Furthermore, the multi-read command can also carry other indicators as immediate data in addition to the number of reads for the burst length. For example, the output strength indicator can be carried to tell the memory how strong the data is to be driven on the system bus.

Figure 7:
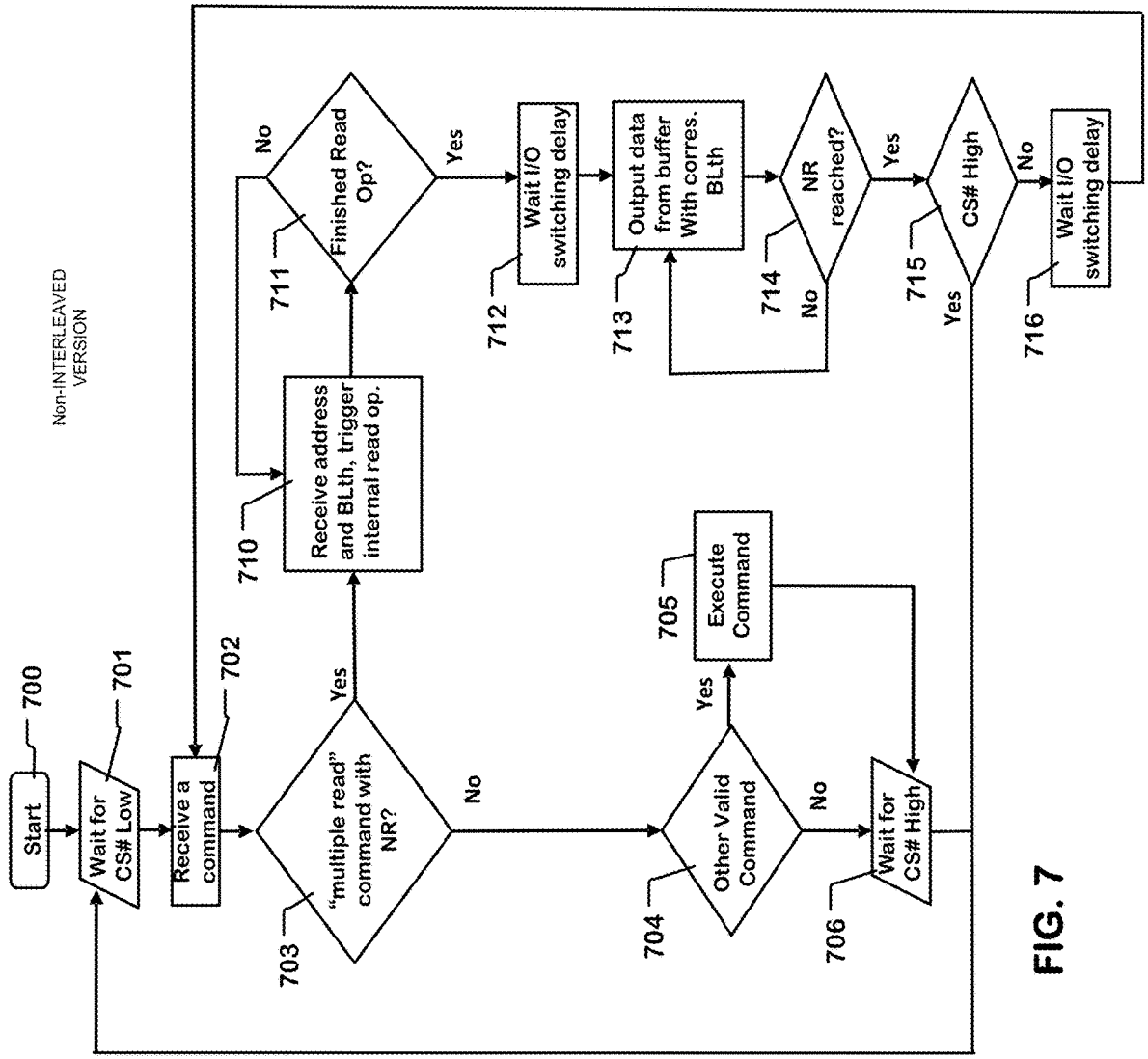
FIG. 7 illustrates a command decoder and control logic for an enhanced read protocol like that of FIGS. 6A and 6B.

FIG. 7 is a flowchart illustrating operation of the command decoder and controller for the execution of a protocol like that of FIGS. 6A and 6B, receiving two or more read addresses, switching to output mode after the read latency for the first address and outputting the data of the first read address, and then having a non-interleaved sequence of data outputs. The operation starts at block 700. The controller waits for transition of the chip select signal to a low state for an active low system (701). Upon transition of the chip select signal, a command is received (702). The command is decoded and it is determined whether it is a multiple read command MR with a number of reads NR parameter (703). If not, it is determined whether another valid command is received (704). If another valid command is received, then the command is executed (705). After executing the command, or if a valid command was not received at block 704, the procedure waits for transition of the chip select signal 706. Upon transition of the chip select signal, the algorithm returns to block 701 to wait for a subsequent transition of the chip select signal.

If, at block 703, it is detected that a multiple read command with a number of reads NR parameter is received, then the address and burst length parameters are received on the I/O port in an input mode, and an internal read operation using for example a read state machine adapted for the particular type of memory array, is triggered using the received address (710). The controller waits until the internal read operation is completed (711) and the data is available at the I/O port, as indicated by the looping back to block 710. Upon completion of the read operation, the controller waits an I/O switching delay while the I/O port is turned around (712). After the switching delay, the data is output from the buffer in the I/O port with a corresponding burst length (713). Next, it is determined whether the number of reads parameter NR has been reached (714). If not, then the algorithm loops to output the next data chunk from the buffer with the corresponding burst length at block 713. If the number of reads parameter has been reached at block 714, then the controller determines whether the chip select signal is high. If not, then the controller waits the I/O switching delay at block 716, and returns to block 702 to wait for the next command. If at block 715 the chip select signal is high, then the algorithm loops back to block 701 to wait for the transition of the chip select signal.

Figure 8:
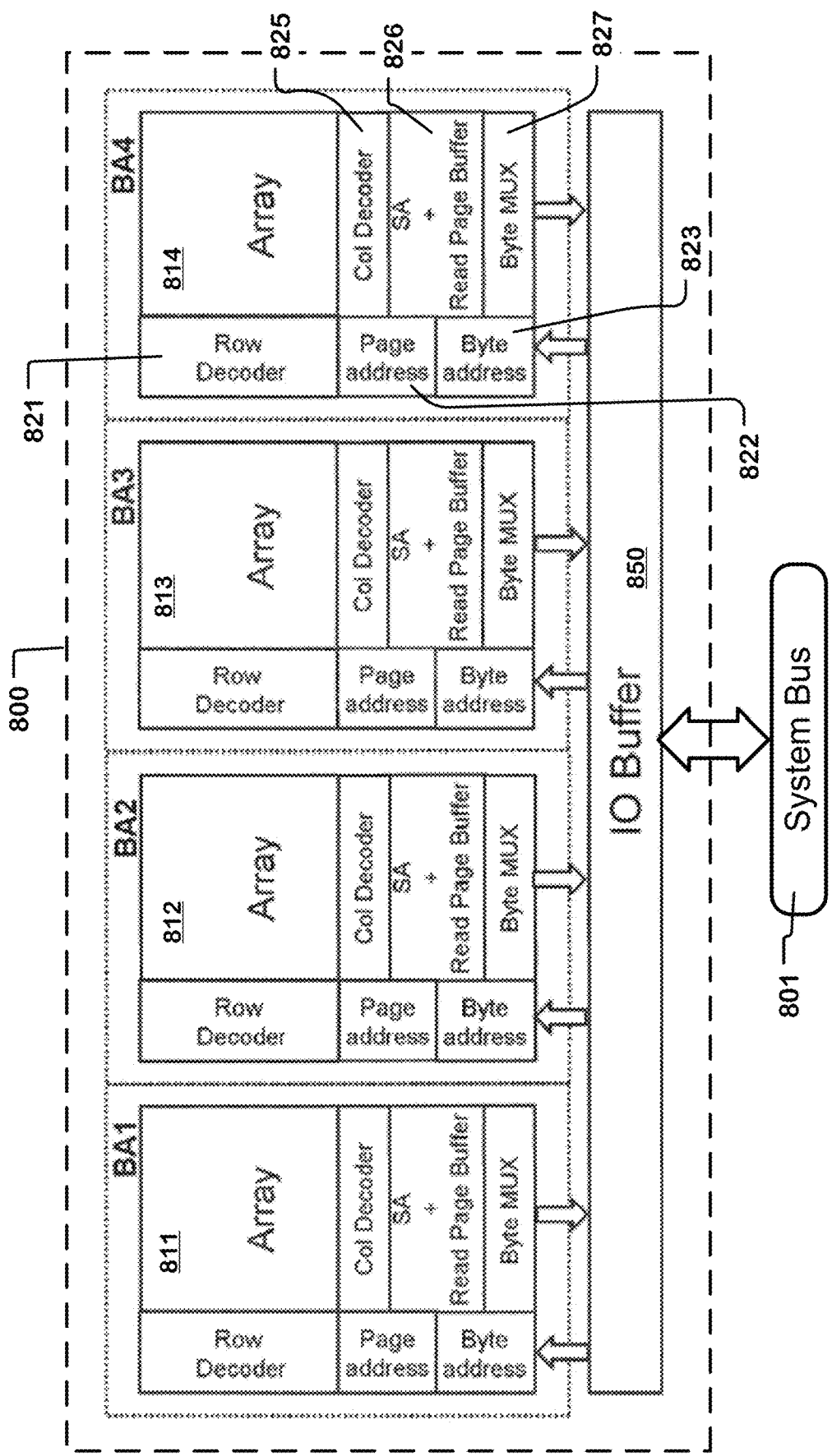
FIG. 8 is a simplified diagram of an integrated circuit memory partitioned into multiple banks supporting two-phase enhanced read capabilities as described herein.

FIG. 8 illustrates aspects of a memory chip architecture for an integrated circuit memory 800 suitable for enhanced read operations as described herein. The memory is partitioned in this example into four banks BA1 to BA4. Each bank (e.g. bank BA4) includes an array 811, 812, 813, 814, coupled with peripheral circuits. Referring to bank 814, the peripheral circuits include a row decoder 821, and a column decoder 825. An input output I/O buffer 850 associated with the I/O port is coupled to the system bus 801. The circuits receive bank addresses which select a bank, and provide page addresses to a page address register (e.g. 822), and byte addresses to a byte address register (e.g. 823). The page address is used to select one of the word lines in the array, and sense results at the sense amplifier and read page buffer (e.g. 826). The byte address operates the byte multiplexer 827, which selects the bytes in the read page buffer to be sent to the I/O buffer 850. The I/O buffer may be used by an SPI port or other I/O port configuration, to output the read data on one or more bi-directional lines. This type of architecture supports enhanced read operations using two types of commands, a read command RCx address to a bank and page in the memory array, and a read-out command ROx addressed to the I/O buffer 850, and linked to a read command by at least a bank address.

Figure 9:
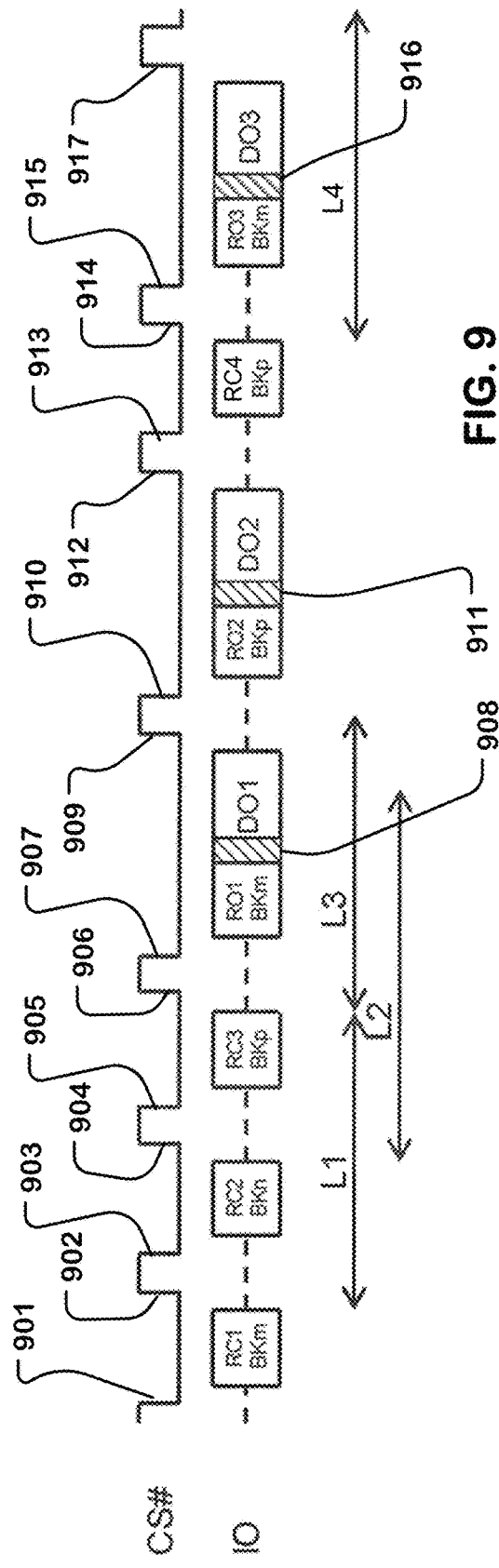
FIG. 9 illustrates a two-phase enhanced read protocol which can be executed on a device like that described with reference to FIG. 8.

FIG. 9 illustrates an enhanced read protocol suitable for a device like that of FIG. 8 using two types of commands, a multiple, or "continuous", read command RCx and a readout command ROx. The read command RCx includes a command instruction code, a bank address and the page address to be accessed. After receiving the read command, the decoder and sense amplifier on the selected bank are activated to do the operations to read data from the array which takes a read latency L1 to the buffer. A readout command ROx includes a command instruction code, a bank address and the byte address to be accessed. After receiving the readout command, the data in the read page buffer of the specified bank is sent to the byte multiplexer and to the I/O buffer on the serial port. The move from the page buffer to the I/O buffer is a much shorter latency than that from the array to the page buffer. The data chunk DOx is output to the system bus in response to the readout command ROx. The read command and read-out command are associated if their bank addresses are the same. For example, if a read command RC1 and read-out commands RO1 and RO3 all specify the same bank, then the readout commands RO1 and RO3 can be issued after the latency L1 associated with the read command RC1.

In the illustrated example, on transition of the chip select signal at time 901, a first read command RC1 is received with a bank address BKm, where m can be any one of banks one through four in the example of FIG. 8. After completion of the read command and address, the chip select signal transitions at time 902 and the system waits for the next transition of the chip select signal. In this example, the chip select signal transitions at time 903 to receive a second read command RC2. The second read command RC2 including bank address BKn is received before the latency L1 associated with the first read command RC1 is expired. In this example, after completion of receiving the second read command RC2, the chip select signal transitions again at time 904. At time 905, the chip select signal transitions to begin input mode on the bidirectional I/O port to receive the third read command RC3 including bank address BKp. After completion of receiving the third read command RC3, the chip select signal transitions again (906), and the system waits for the chip select signal to transition low at time 907. At time 907, the read latency L1 for the first read command is expired, and the system receives the first readout command RO1 including bank address BKm, matching the bank address of the first read command RC1. On completion of receiving the first readout command, data in the page read buffer is moved to the I/O buffer during latency 908, and the I/O bus switches from the input mode to the output mode. After latency 908, the data chunk DO1 responsive to the first read command RC1 is output.

Upon completion of the outputting of the data chunk DO1, the chip select signal transitions again at time 909, and then the system waits for it to transition at time 910. At time 910, the latency L2 associated with the second read command RC2, and the latency L3 associated with the third read command RC3 are both completed. Thus, the system receives, and can process, a second readout command RO2 with bank address BKp, which matches the bank address of the third read command RC3. After receiving the second readout command, and the latency 911 for moving the data to the I/O buffer, the data chunk DO2 responsive to the third read command RC3 is output.

The chip select signal transitions again at time 912, and then the system waits for it to transition at time 913. Then, the system receives a fourth read command RC4 with bank address BKp. After receiving the fourth read command RC4, the chip select signal transitions high at time 914.

After transition low at time 915, the latency L1, L2 and L3 associated with the first, second and third read commands RC1, RC2, and RC3 are completed. Thus, the system receives, and can process a third readout command RO3 with any of the bank addresses BKp, BKn or BKp, which matches the bank address of one of the read commands RC1, RC2 or RC3. After receiving the third readout command, in the example a bank address matching that of the first read command RC1, and the latency 916 for moving the data to the I/O buffer, the data chunk DO3 responsive to the first read command RC1 is output. Thereafter, the chip select signal transitions at time 917. The process can continue as necessary.

Figure 10:
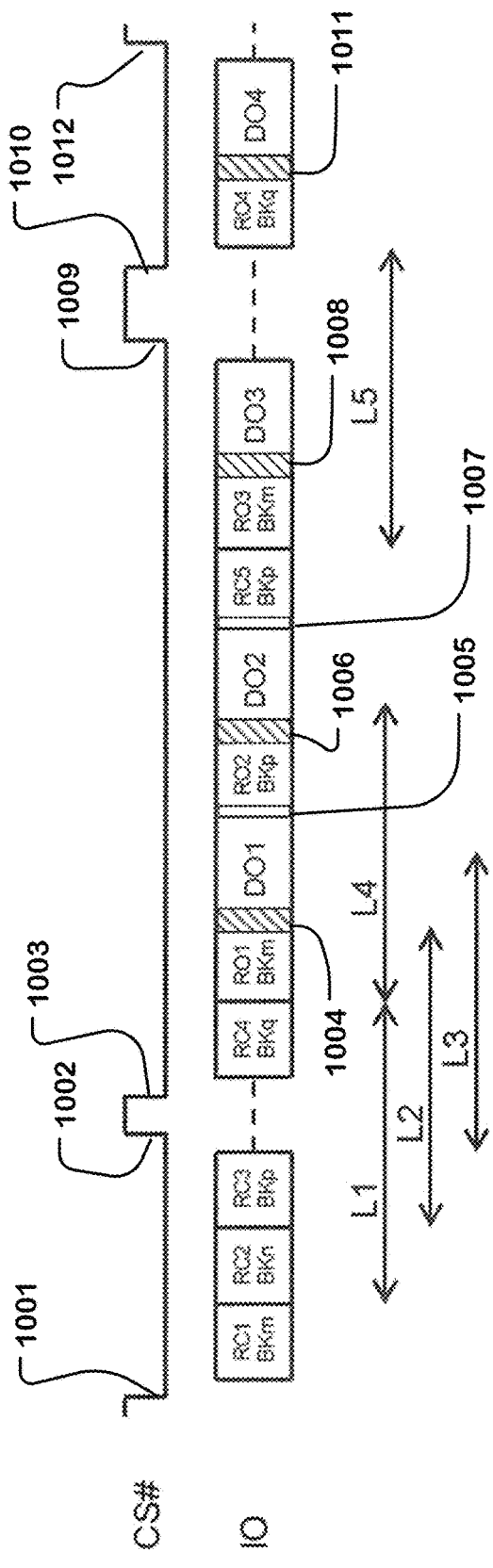
FIG. 10 illustrates another embodiment of a two-phase enhanced read protocol which can be executed on a device like that described with reference to FIG. 8.

FIG. 10 illustrates an alternative flow using multiple, or "continuous", read commands and read-out commands as discussed above in connection with FIG. 9. In the embodiment of FIG. 10, commands can be received at times other than the transition of the chip select signal, including after finishing of a preceding read command, and after finishing of a preceding data output, with any necessary output-to-input switching latency required to turn around the bidirectional I/O port. Thus, as illustrated at time 1001, first second and third read commands RC1, RC2 and RC3 are received without intervening switching on the chip select line. In some embodiments the first bit of RC(x) is received contiguously in the next clock cycle after the last bit of the previous RC(x−1). Upon completion of receiving RC3, the chip select signal transitions at times 1002 and 1003. After transition at time 1003, a next read command RC4 is received followed contiguously by a first read-out command RO1 after completion of the latency L1. The first read-out command RO1 includes the bank address BKm matching that of the first read command RC1. This causes the data moved from the page buffer to the I/O buffer with the read-out latency 1004, followed by the data chunk DO1. After completion of outputting the data chunk DO1, the I/O bus executes a turnaround, with an output to input switching latency 1005, and thereafter a second read-out command RO2 is received, without an intervening transition of the chip select signal. In this example, RO2 as the same bank address as the third read command RC3 and is received after completion of the latency L3. Thus, after the read-out latency time 1006, the second data chunk DO2 from bank BKp is output on the system bus. In this example, the I/O bus turns around at time 1007, and a fifth read command RC5 is received followed by a third read-out command RO3. In this example, the third read-out command is the bank address of the first read command RC1, and after the read-out latency 1008, the third data chunk DO3 is output. In this example, the chip select signal transitions at time 1009. At time 1010, the chip select signal transitions again and a fourth read-out command RO4 is received. After the read-out latency 1011, the fourth data chunk DO4 is output. Finally, the chip select signal transitions at time 1012 to complete this operation.

The embodiment shown in FIG. 10 can improve I/O bus utilization by reducing the time period required by the chip select high to low transitions.

In some embodiments, the read-out commands can carry a burst length indicators BL to specify the data link to the corresponding data output. For example, RO2 might indicate a burst length of 32 bytes, while the read-out commands RO1, RO3 and RO4 indicate a burst length of 16 bytes.

Figure 11:
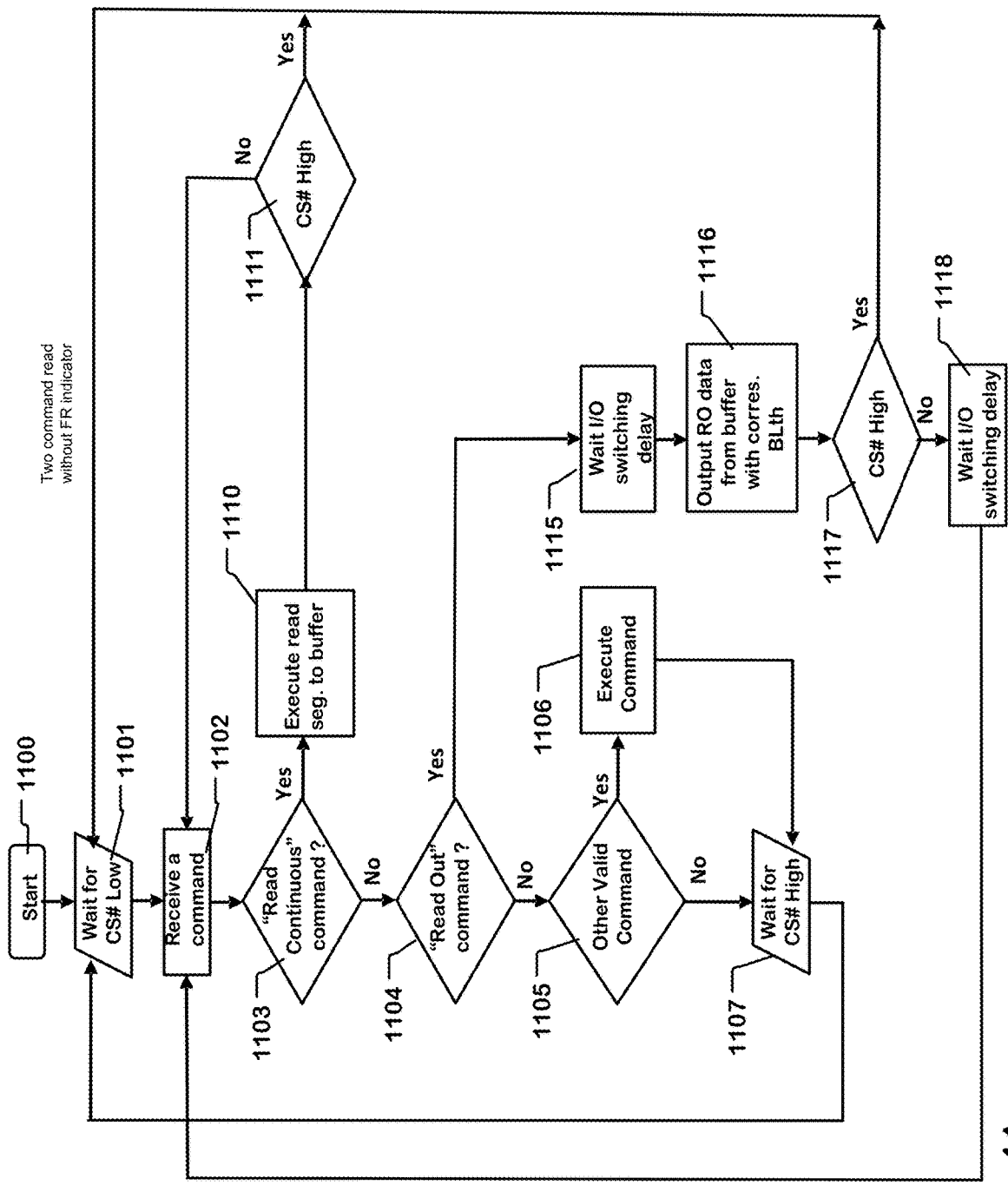
FIG. 11 illustrates a command decoder and control logic for an enhanced read protocol like that of FIG. 9 without a final read indicator.

FIG. 11 is a flowchart illustrating logic executed by a command decoder and controller for protocol like that of FIG. 10. The operation starts at block 1100. The controller waits for transition of the chip select signal to a low state for an active low system (1101). Upon transition of the chip select signal, a command is received (1102). The command is decoded and it is determined whether it is a continuous read command RCx (1103). If not, it is determined whether the command is a read-out command ROx (1104). If not, it is determined whether another valid command is received (1105). If another valid command is received, then the command is executed (1106). After executing the command, or if a valid command was not received at block 1106, the procedure waits for transition of the chip select signal 1107. Upon transition of the chip select signal, the algorithm returns to block 1101 to wait for a subsequent transition of the chip select signal.

If at block 1103, it is detected that a read command is received, then an internal read operation using for example a read state machine adapted for the particular type of memory array, is triggered using the bank and page address to move the page to the page buffer (1110). Then the procedure determines whether the chip select signal is high (1111), and if so, then it loops to block 1101 to wait for chip select to transition low, and waits for a next command cycle. If at block 1111, the chip select signal remains low, then the procedure loops to block 1102 to receive a next command in the multi-address read operation on the system I/O bus.

If at block 1104, a read-out command is detected, then the logic waits the I/O switching delay to turn around the I/O port (1115), and outputs the ROx data chunk DOx from the page buffer to the I/O buffer, with the corresponding burst length (1116). If at this time, the read operation moving the data of the first address in the address sequence to the buffer is not complete, then the read out operation waits until the data is available in the buffer. Then the procedure determines the state of the chip select signal (1117). If chip select is high, then the procedure loops to block 1101. If chip select remains low at block 1117, then the I/O bus turns around, and after waiting the I/O switching delay (1118), the procedure loops to block 1102 to receive a next command.

A similar logic is applied for the protocol of FIG. 9, modified (e.g. at block 1111) to require a chip select transition before receiving a next command.

Figure 12:
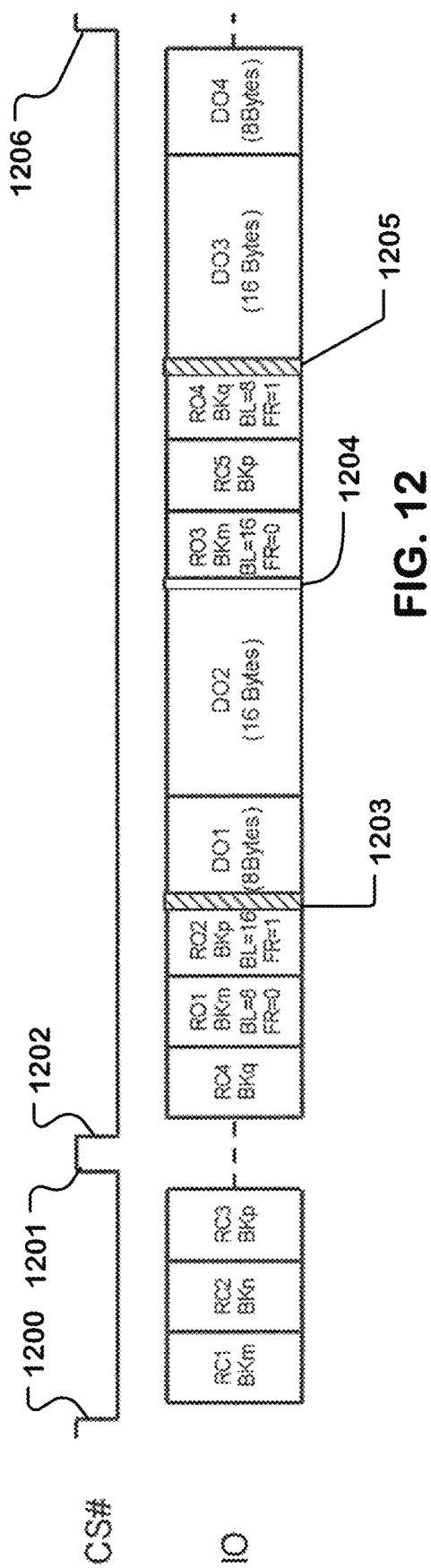
FIG. 12 illustrates another embodiment of a two-phase enhanced read protocol, including burst length and final read indicator parameters.

FIG. 12 illustrates yet another protocol including continuous read commands and read-out commands, with the addition of fewer chip select transitions, along with burst length parameters and final read indicators. The protocol illustrated, the chip select signal transitions at time 1200, and three read commands RC1, RC2 and RC3 are received contiguously until the chip select signal transitions at time 1201. At time 1202, the chip select signal transitions low again, and a fourth read command RC4 is received followed by two contiguous read-out commands RO1 and RO2. The first read-out command RO1 includes a burst length parameter of eight bytes, and a final read flag equal to zero. The second read-out command RO2 includes a burst length parameter equal to 16 bytes, and a final read flag equal to one. This indicates that it is the last read command in the sequence. Thus the controller turns around the I/O bus, and moves data chunk DO1 from bank BKm of the first read-out command RO1 and the first read command RC1, to the I/O buffer, and after latency 1203 for the data movement and turn around, outputs the first data chunk DO1, having a length of eight bytes, followed by the second data chunk DO2 having a length of 16 bytes from the bank BKp (corresponding to the third read command RC3). After a turn-around latency 1204, the I/O bus turns around, and a next read-out command RO3 is received followed by a next read command RC5 and a fourth read-out command RO4 in sequence. The fourth read-out command RO4 has the final read flag FR set to one, so the system moves data from bank BKm indicated in the third readout command RO3 to the I/O buffer, and after latency 1205 for the data movement and turn around, outputs the third data chunk DO3 with a burst length of 16 bytes, followed by the fourth data chunk DO4 with a burst length of eight bytes. In this example, the chip select signal transitions at time 1206 back to a high state.

In this protocol, the memory outputs data after receiving a read-out command with the final read flag equal to one such as in the read-out commands RO2 and RO4 in the example. The memory outputs data sequentially in response to the previous read-out command (data chunk DO1 and data chunk DO2). As illustrated, multiple read commands as well as the corresponding data chunks can be issued in a group manner. Thus the read-out latency and output to input switching latency can be further offset. The bus transfer efficiency is therefore improved even further for this embodiment.

In the illustrated embodiments, the burst length parameter is carried with the read-out command. In other embodiments, the burst length can be preconfigured or carried with the corresponding read command. In some sequences, the short latency required between each read-out command and its corresponding output data may be encountered. However, this read-out latency is much shorter than the read latency required to move the data from the memory array into the page buffer.

In other embodiments, the read command can include other indicators in addition to the page address. For example, the read command may carry as immediate data the required number of clock signals needed to satisfy the read latency. Also, the read-out command can carry as immediate data other indicators in addition to the by address, the burst length and the final read flag. For example, the read-out command may include as immediate data the required latency clock count to be waited for moving the data from the page buffer to the I/O buffer.

Figure 13:
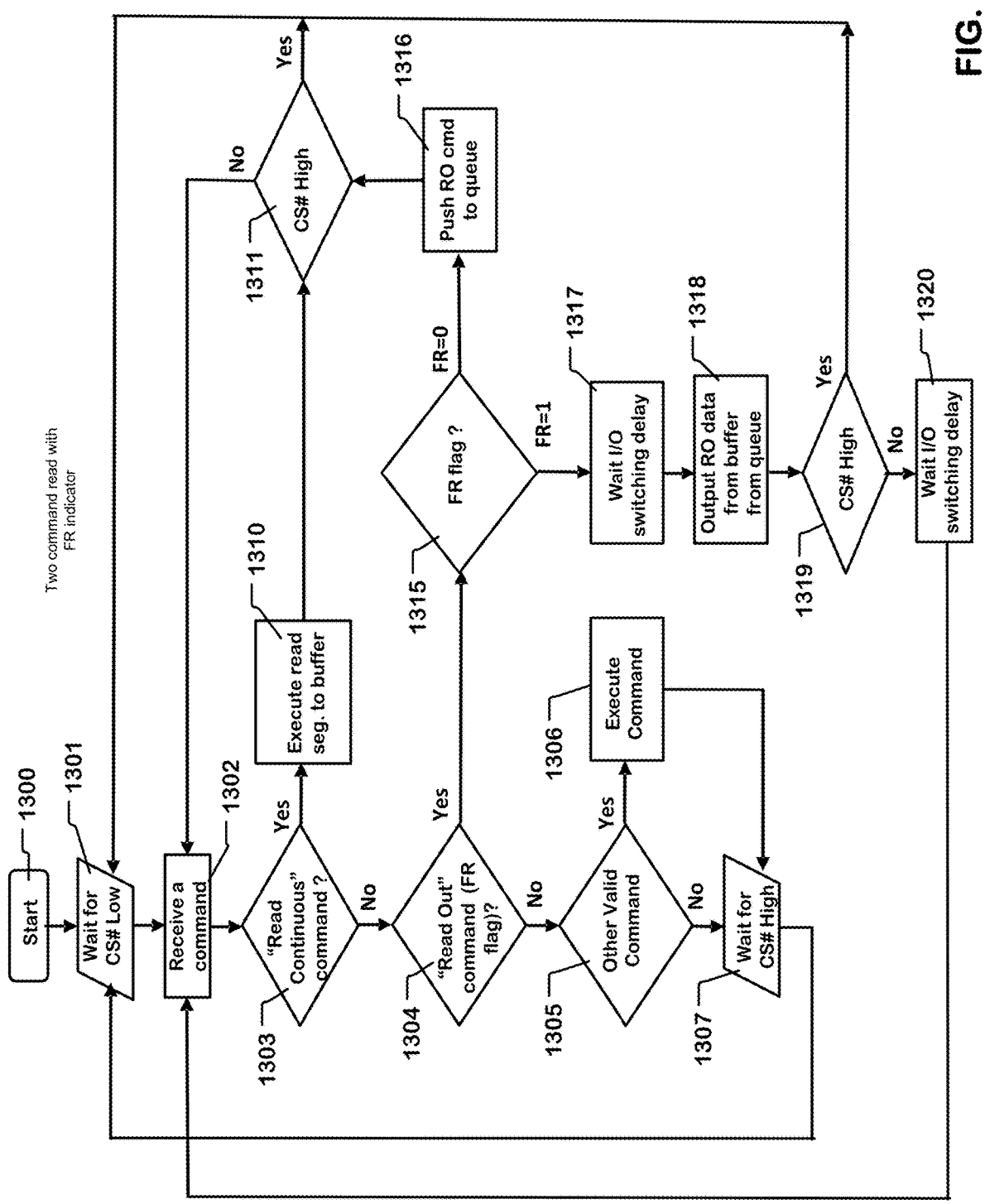
FIG. 13 illustrates a command decoder and control logic for an enhanced read protocol like that of FIG. 12.

FIG. 13 is a flowchart illustrating command decoder and control logic which can be used with the system implementing an embodiment like that of FIG. 12. The operation starts at block 1300. The controller waits for transition of the chip select signal to a low state for an active low system (1301). Upon transition of the chip select signal, a command is received (1302). The command is decoded and it is determined whether it is a continuous read command RCx (1303). If not, it is determined whether the command is a read-out command ROx with an FR flag (1304). If not, it is determined whether another valid command is received (1305). If another valid command is received, then the command is executed (1306). After executing the command, or if a valid command was not received at block 1306, the procedure waits for transition of the chip select signal 1307. Upon transition of the chip select signal, the algorithm returns to block 1301 to wait for a subsequent transition of the chip select signal.

If at block 1303, it is detected that a read command is received, then an internal read operation using for example a read state machine adapted for the particular type of memory array, is triggered using the bank and page address to move the page to the page buffer (1310). Then the procedure determines whether the chip select signal is high (1311), and if so, then it loops to block 1301 to wait for chip select to transition low, and waits for a next command cycle. If at block 1311, the chip select signal remains low, then the procedure loops to block 1302 to receive a next command on the system I/O bus.

If at clock 1304, a read-out command is detected, then the system checks the final read flag (1315). If the final read flag is clear (equal to zero), then the read-out command is pushed into a command queue for output after the final read flag is set (1316). Next, the algorithm determines whether the chip select signal is high (1311) and proceeds accordingly. If at block 1315, the FR flag is set (equal to one), then after waiting for the I/O switching delay (1317), the controller outputs the data chunks DOx from the ROx commands in the queue (1318). After outputting the sequence of data chunks data, the algorithm determines whether the chip select signal is high (1319). If not, then after waiting the I/O switching delay 1320, the algorithm loops back to block 1302 to receive a next command. If the chip select signal is not high at block 1319, in the algorithm loops back to block 1301 to wait for transition of the chip select signal. This cycle continues as necessary to complete the read operation.

A number of flowcharts illustrating logic executed by a memory controller or by memory device are described herein. In the flow charts, the chip select signal is relied upon as the control signal indicating starting and stopping of operations. In some embodiments, other control signals can replace the chip select signal, or be used in combination with the chip select signal for this purpose.

The logic illustrated in the flow charts can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Thus, the memory device is described roughly illustrated in FIG. 1, having a bidirectional I/O interface where command address and data are transferred through the same I/O bus bidirectionally, such that in order to change from an input mode to an output mode, at least one signal line on the bus has to change directions. The system is capable of executing multiple read operations in an overlapping manner, after receiving two or more of a first type of read command, before executing a second type of read command to output the data. In the illustrated system, second read command can be received after receiving a first read command, and before the read-out command corresponding to the first read command is executed. The first read command in the first read-out command are associated because they specify the same bank address in some embodiments. The read commands can include a command code, a bank address and a page address for page mode memories. The read-out command can include a bank address and a bite address to identify the data output chunks associated with the read-out command. In some embodiments, sequential read commands are constrained address different banks in a memory device.

Also, the memory can receive a read command after a chip select signal transitions. Also, the memory can receive a read command after finishing receiving a preceding read command. Also, the memory can receive a read command right after finishing a data output of the specified length, using a data link that is preconfigured in some embodiments, or carried as media data with a read-out command in other embodiments.

The technologies described providing low pin count memory capable of receiving and delivering multiple read commands, addresses or data outputs on a bidirectional I/O port, wherein one or more next read commands (the second read, the third read . . . , RA2/RA3, or RC2/RC3) can be issued or received before the output (first output data chunk DO1) that corresponds to the first read command and address.

A number of embodiments are described in which there is at least one set of bidirectional I/O ports, or signal lines, for executing a read command/read address/data output sequence. Thus, low pin count memory is provided capable of receiving and delivering multiple read commands, addresses and data outputs on a bi-directional I/O port with improved efficiency and throughput. The protocols described enable read sequences that make efficient use of the read latency between read commands and the output of corresponding data to provide improved throughput and bus efficiency.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a memory array and an input/output port having an input mode and an output mode, wherein the input/output port has at least one signal line used alternately in both the input and output modes; and
a controller including logic configured to execute a multi-address read operation in response to receiving a read command on the input/output port in the input mode, the multi-address read operation including receiving a first address and a second address using the at least one signal line in the input mode before switching to the output mode, switching to the output mode and outputting data identified by the first address using the at least one signal line.

2. The memory device of claim 1, wherein the multi-address read operation includes:
applying the first address to the memory array in response to which a first data chunk identified by the first address is available for output on the input/output port after a first latency; and including:
before expiration of the first latency, receiving the second address on the input/output port in the input mode;
applying the second address to the memory array in response to which a second data chunk identified by the second address is available for output on the input/output port after a first latency; and
outputting the second data chunk after the second latency on the input/output port in the output mode.

3. The memory device of claim 1, wherein the read command indicates beginning of the multi-address read operation.

4. The memory device of claim 2, wherein the first and second data chunks have different lengths.

5. The memory device of claim 1, wherein the read command is received with data indicating a number of addresses to be received before switching to the output mode in the multi-address read operation.

6. The memory device of claim 1, wherein the multi-address read operation includes receiving the read command upon transition of a control signal, and receiving the first address and second address without an intervening transition of the control signal.

7. The memory device of claim 1, wherein the multi-address read operation includes after outputting the data identified by the first address, switching to the input mode and receiving a sequence of read addresses for subsequent data chunks interleaved with switching to the output mode and outputting data chunks identified by preceding read addresses in the sequence of read addresses.

8. The memory device of claim 1, wherein the multi-address read operation includes receiving a plurality of read addresses, the plurality of read addresses including the first and second addresses, and a read address in the plurality of read addresses for a last data chunk in the multi-address read operation is received with a final read indicator as immediate data, and the multi-address read operation includes outputting the last data chunk after outputting a chunk identified by an immediately preceding address without changing the input/output port from output mode to input mode for intervening input.

9. The memory device of claim 1, wherein the multi-address read operation includes receiving a plurality of read addresses, the plurality of read addresses including the first and second addresses, and one or more of the read addresses in the multi-address read operation are received with burst length indicators as immediate data, indicating a length of data chunks identified by the read addresses.

10. The memory device of claim 1, wherein one or more of the read addresses is received with immediate data identifying a setting applied in the multi-address read operation.

11. The memory device of claim 2, wherein the multi-address read operation includes, before outputting the second data chunk, and after outputting the first data chunk in the output mode, stopping the output mode and then starting the input mode on the input/output port, and then receiving on the input/output port in the input mode a third address identifying a third data chunk, and applying the third address to the memory array in response to which a third data chunk is available for output after a third latency.

12. The memory device of claim 1, wherein the multi-address read operation includes receiving a number of addresses in sequence in the multi-address read operation on the input/output port without intervening output on the input/output port, and after receiving the number of read addresses, changing the input/output port to the output mode and outputting chunks identified by the received number of addresses in sequence without intervening input on the input/output port.

13. The memory device of claim 12, wherein the read command is received with immediate data indicating the number of addresses.

14. The memory device of claim 12, wherein the number of addresses is set by a stored configuration parameter.

15. The memory device of claim 1, wherein the read addresses are received with immediate data indicating a chunk length for data chunks identified by the addresses.

16. The memory device of claim 1, wherein the multi-address read operation includes, before outputting the data identified by the first address, moving the data identified by the first address to a buffer, receiving a read-out command associated with the first address, and after the data identified by the first address is available in the buffer, outputting the data identified by the first address in response to the read-out command.

17. The memory device of claim 1, wherein the memory array includes a plurality of banks, and the first and second addresses include a bank address of a first data segment and a second data segment, respectively, and wherein the multi-address read operation includes, before outputting the data identified by the first address, receiving a read-out command including the bank address and identifying the first segment, and outputting a first chunk of the first segment in response to the read-out command.

18. The memory device of claim 17, wherein the multi-address read operation includes receiving a read command and first address between a first pair of transitions of a control signal, and receiving the second address between a second pair of transitions of the control signal.

19. The memory device of claim 17, wherein the multi-address read operation includes receiving the read command and first address between a first pair of transitions of the control signal, and receiving the read-out command and outputting the first data chunk between a subsequent pair of transitions of the control signal.

20. The memory device of claim 17, wherein the read command includes an instruction code, and an address identifying a bank and a page of the first data segment, and the read-out command includes an instruction code, and an address identifying the bank and a byte address of the data chunk of the first data segment to be output.

21. A method for executing a multi-address read operation on a memory device including a memory array and an input/output port having an input mode and an output mode, wherein the input/output port has at least one signal line used alternately in both the input and output modes, the method comprising:
  receiving a read command on the input/output port in the input mode in a multi-address read operation, and in response to the read command, receiving a first address and a second address using the at least one signal line in the input mode before switching to the output mode;
  switching to the output mode; and
  outputting data identified by the first address using the at least one signal line.

22. The method of claim 21, including:
  applying the first address to the memory array in response to which a first data chunk identified by the first address is available for output on the input/output port after a first latency; and including:
    before expiration of the first latency, receiving the second address on the input/output port in the input mode;
    applying the second address to the memory array in response to which a second data chunk identified by the second address is available for output on the input/output port after a first latency; and
    outputting the second data chunk after the second latency on the input/output port in the output mode.

23. The method of claim 21, wherein the read command indicates beginning of the multi-address read operation.

24. The method of claim 22, wherein the first and second data chunks have different lengths.

25. The method of claim 21, wherein the read command is received with data indicating a number of addresses to be received before switching to the output mode in the multi-address read operation.

26. The method of claim 21, including receiving the read command upon transition of a control signal, and receiving the first address and second address without an intervening transition of the control signal.

27. The method of claim 21 including, after outputting the data identified by the first address, switching to the input mode and receiving a sequence of read addresses for subsequent data chunks interleaved with switching to the output mode and outputting data chunks identified by preceding read addresses in the sequence of read addresses.

28. The method of claim 21, wherein the multi-address read operation includes receiving a plurality of read addresses, the plurality of read addresses including the first and second addresses, and a read address for a last data chunk in the multi-address read operation includes a final read indicator as immediate data, and the multi-address read operation includes outputting the last data chunk after outputting a chunk identified by an immediately preceding address without changing the input/output port from output mode to input mode for intervening input.

29. The method of claim 21, wherein the multi-address read operation includes receiving a plurality of read addresses, the plurality of read addresses including the first and second addresses, and one or more of the read addresses in the multi-address read operation are received with burst length indicators as immediate data, indicating a length of data chunks identified by the read addresses.

30. The method of claim 21, wherein one or more of the read addresses is received with data identifying a setting applied in the multi-address read operation.

31. The method of claim 22 including, before outputting the second data chunk, and after outputting the first data chunk in the output mode, stopping the output mode and then starting the input mode on the input/output port, and then receiving on the input/output port in the input mode a third address identifying a third data chunk, and applying the third address to the memory array in response to which a third data chunk is available for output after a third latency.

32. The method of claim 21 including receiving a number of addresses in sequence in the multi-address read operation on the input/output port without intervening output on the input/output port, and after receiving the number of read addresses, changing the input/output port to the output mode and outputting chunks identified by the received number of addresses in sequence without intervening input on the input/output port.

33. The method of claim 32, wherein the read command is received with data indicating the number of addresses.

34. The method of claim 32, wherein the number of addresses is set by a stored configuration parameter.

35. The method of claim 32, wherein the read addresses are received with data indicating a chunk length for a data chunk identified by the address.

36. The method of claim 21 including, before outputting the data identified by the first address, moving the data identified by the first address to a buffer, receiving a read-out command associated with the first address, and after the data identified by the first address is available in the buffer, outputting the data identified by the first address in response to the read-out command.

37. The method of claim 21 wherein the memory array includes a plurality of banks, and the first and second addresses include a bank address of a first data segment and a second data segment, respectively, and including, before outputting the data identified by the first address, receiving a read-out command including the bank address and identifying the first segment, and outputting a first data chunk of the first segment in response to the read-out command.

38. The method of claim 37, including receiving a read command and first address between a first pair of transitions of a control signal, and receiving the second address between a second pair of transitions of the control signal.

39. The method of claim 37, including receiving the read command and first address between a first pair of transitions of the control signal, and receiving the read-out command and outputting the first data chunk between a subsequent pair of transitions of the control signal.

40. The method of claim 37, wherein the read command includes an instruction code, and an address identifying a bank and a page of the first data segment, and the read-out command includes an instruction code, and an address identifying the bank and a byte address of the data chunk of the first data segment to be output.

* * * * *